United States Patent [19]

Kazuhiko

[11] Patent Number: 5,178,050
[45] Date of Patent: Jan. 12, 1993

[54] DIE FOR USE IN FINE PRESS WORKING

[76] Inventor: Kato Kazuhiko, 115, Ouazashimoichibu, Sasagamimura, Kitakanbaragun, Niigataken, Japan

[21] Appl. No.: 821,760

[22] Filed: Jan. 15, 1992

[30] Foreign Application Priority Data

Jan. 28, 1991 [JP] Japan .................................. 3-8740

[51] Int. Cl.⁵ .............................................. B26F 1/14
[52] U.S. Cl. ....................................... 83/620; 83/686; 83/687; 83/690
[58] Field of Search ................. 83/620, 687, 684, 685, 83/686, 691, 690; 29/741; 76/107.1, 107.4, 81.1, 81.2

[56] References Cited

U.S. PATENT DOCUMENTS 3,797,342  3/1974  Sekel .................................. 83/620 X
4,085,639  4/1978  Marconi ............................ 83/685 X
4,791,844  12/1988  Yonezawa ........................ 83/620 X
4,819,316  4/1989  Rossini et al. .................... 83/620 X Primary Examiner—Frank T. Yost
Assistant Examiner—Kenneth Peterson
Attorney, Agent, or Firm—Koda and Androlia

[57] ABSTRACT

The object of the invention is to reduce the number of the producing processes of an IC lead frame.

In the present invention, a plurality of punches 17 are provided protruding from the base 16 in such a manner that their surfaces are disposed approximately radially, and the reinforcing punch 23 which connects the cutting blades 18 of the punches 17 with each other, is provided between the cutting blades 18, and protruding from the base 16.

The punches 17 are integrated by the reinforcing punch 23, so that the strength of each punch 17 is improved and the number of punched holes in one process can be increased.

8 Claims, 5 Drawing Sheets

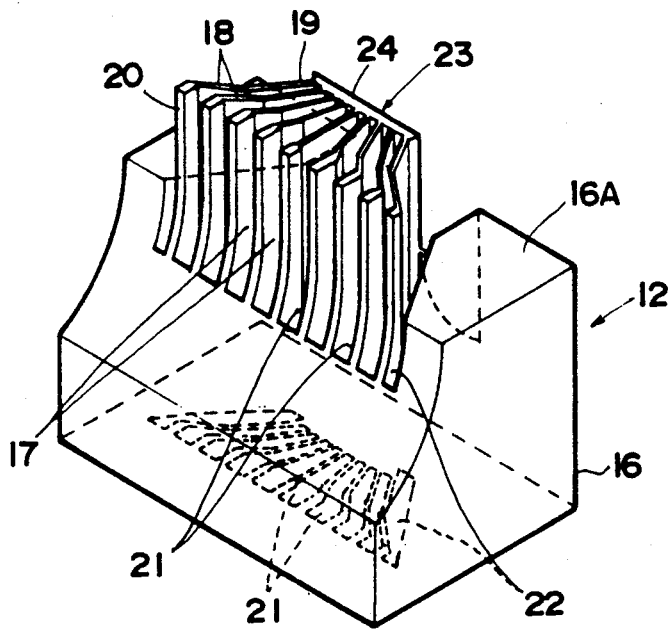

DIE FOR USE IN FINE PRESS WORKING

BACKGROUND OF THE INVENTION

The present invention relates to a die for use in fine press working which is applied to ultra-precision processing of IC lead frames.

As shown in FIG. 6, an IC is generally structured in such a manner that: an IC chip 3 is adhered onto a pad 2 provided in the center of a lead frame 1; tips of inner leads 5 of leads 4 are connected with electrodes of the IC chip 3, using fine wires made of gold, aluminum or copper; and after that, the IC chip 3 is enclosed with mold resin 7. Numeral 5A is an outer lead.

As the IC chip 3 is highly improved, the number of its electrodes is increased. Accordingly, the number of the leads 4 of the lead frame 1 must be increased. However, the more the number of the leads 4 is increased, the smaller the widths of the leads 4 become, and also the more the number of the leads 4 is increased, the smaller the intervals of the leads 4 become, so that it is difficult to punch the leads 4.

FIGS. 7 and 8 show a conventional example of punching. A plate 8 made of copper alloy is successively fed, and the pad 2 is formed first. Next, as shown in the first process represented by character A, punch holes 9 are formed on both sides of the pad 2. The punch holes 9 are formed with a male die composed by combining and fixing with a holder (not shown) base portions 10B of various punches 10, the tips of which are formed into cutting blades 10A as shown in FIG. 7, a so as to form the male die. Thereafter, new punch holes 9A are formed between the punch holes 9 as shown in the second process represented by character B, and further increasing the number of the punch holes 9 as shown in the processes of C to E. Each of the aforementioned processes is effected by a male and a female die corresponding to each process.

In the aforementioned prior art, for example, all the punch holes 9 on one side of the pad 2 can not be punched simultaneously. Therefore, they are punched through a plurality of processes. Accordingly, there is a risk of lowering the efficiency of the punching operation.

In order to solve the aforementioned problem, a means is suggested in which a large number of punches are provided to the male die correspondingly to punch holes. However, when the male die provided with a large number of punches is used to punch a plate continuously, there is a possibility that the narrow punches are deformed and damaged. The reason is that the punches being held by the holder through their base portions 10B, the strength of the punch 10 at the time of punching is low. Especially because the thickness of the punch 10 on the cutting blade 10A side is extremely thin.

SUMMARY OF THE INVENTION

It is a primary object of the present invention to solve the aforementioned problems and to provide a die for use in fine press working in which the strength of punches formed on the male die is improved so as to punch more holes in one punching operation.

The present invention is to provide a die for use in fine press working having a male die from which a plurality of punches are protruded approximately radially, and a female die provided with a plurality of holes into which the aforementioned punches are inserted so as to form punch holes in a work piece, comprising: a base provided to the aforementioned male die, wherein the aforementioned plurality of punches are integrally protruding from the base; and a reinforcing punch provided between the tips of the aforementioned plurality of punches in such a manner that the reinforcing punch is formed integrally with the aforementioned punches and base. In the present invention, the work piece is a lead frame, and the aforementioned reinforcing punch is correspondingly provided on the inner lead side.

The apparatus being structured in the manner mentioned above, when a plate is punched by a punch inserted into a hole formed in the female die, the punching operation can be favourably carried out without causing deformation and damage of the die since the strength of the punch is improved by the reinforcing punch.

DETAILED DESCRIPTION OF THE PREFERRED EMBODIMENTS

Referring now to FIG. 1 to FIG. 5, an example of the present invention will be explained. In the punching apparatus of this embodiment, a male die 12 is provided on an upper template 11, and a female die 14 is provided on a lower template 13. A plate (not shown) is intermittently fed between the male die 12 and the female die 14, and when the feeding motion of the plate is stopped, the upper template 11 descends so that the male die 12 is inserted into the female die 14 to effect punching. In this punching apparatus, the upper template 11 and the lower template 13 are opposed to each other, being guided by guide members (not shown), and the plate to be punched is clamped by a widely known clamp device which clamps the plate appropriately.

Figure 1:
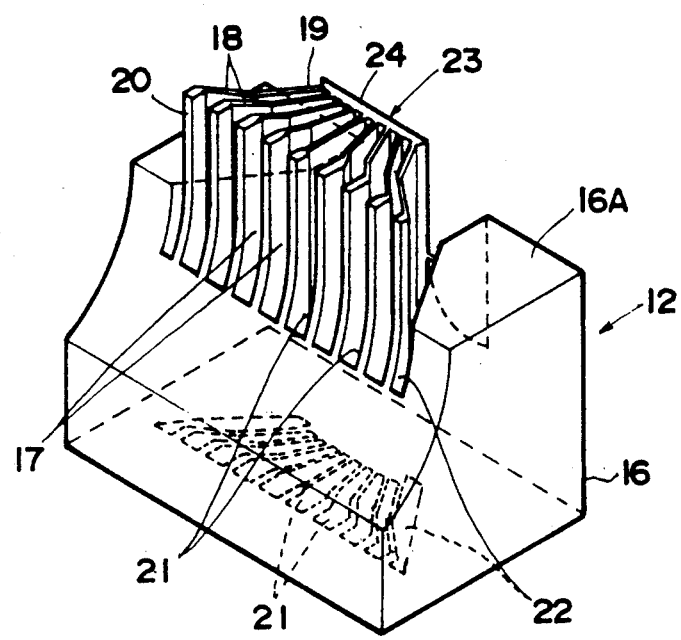
FIG. 1 is a perspective view of a male die of an example of the present invention.
Figure 2:
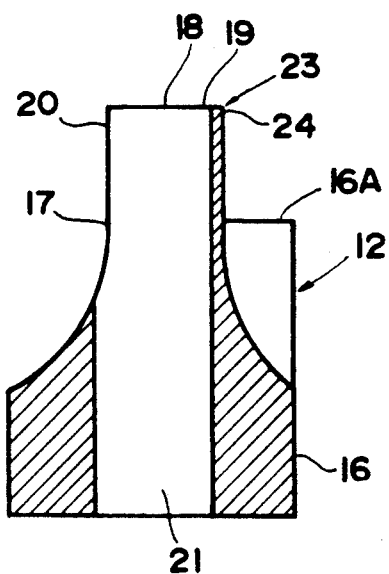
FIG. 2 is a sectional view of a male die of the example of the present invention.
Figure 3:
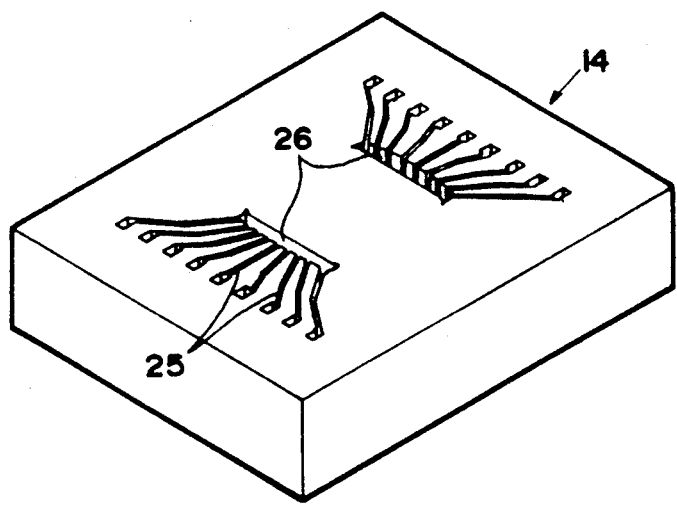
FIG. 3 is a perspective view of a female die of the example of the present invention.

The male die 12 shown in FIGS. 1 and 2 is comprised of: a base 16, the surface of which is rectangular, wherein the base 16 is press-fitted into the template 11 or fixed to the template 11 through a fixing member (not shown); and a large number of punches, the surfaces of which radially protrude longitudinally from the base 16. Nine punches 17 symmetrically protrude from the aforementioned male die 12. The aforementioned punch 17 is narrow and tabular and is composed in such a manner that: a cutting blade 18 is formed correspondingly to the aforementioned lead 4; the width of the punch 17 on one side 19 corresponding to the aforementioned inner lead 5 is formed narrow; and that of the other side 20 corresponding to an outer lead 5A is formed thick. Further, as is clearly shown in FIG. 1, the intervals of the punches on the inner lead side are narrower than those of the same punches on the outer lead side. Slots 21 which penetrate the base 16 are formed between the punches 17. Slots 22 are formed between the punches 17 disposed outside and the base 16.

A reinforcing punch 23 to integrally connect the punches 17 is provided to one side 19, that is a narrow side, of each cutting blade 18. This reinforcing punch 23 is extended to the upper surface side of the base 16, and is formed narrow and tabular in cross connection with the punches. Furthermore, the reinforcing punch is thicker than the punches 17 on one side, that is the inner lead side, and a cutting blade 24 is formed on the tip of the reinforcing punch 23. Protruded portions 16A are formed on both sides of the base 16. The male die 12 is made of cemented carbide and machined by means of wire-EDM and as clearly shown in the figures, a lateral hole is provided corresponding to the inner lead side.

On the other hand, in the female die 14 which is press-fitted into the lower template 13 in such a manner that it is opposed to the male die 12, holes 25 which are slightly larger than the punches 17 are formed correspondingly to the punches 17. A lateral hole 26 which is slightly larger than the reinforcing punch 23 and communicating with the aforementioned hole 25 is formed in the female die 14 correspondingly to the reinforcing punch 23. This female die 14 is also made of cemented carbide and machined by means of wire-EDM.

Figure 4:
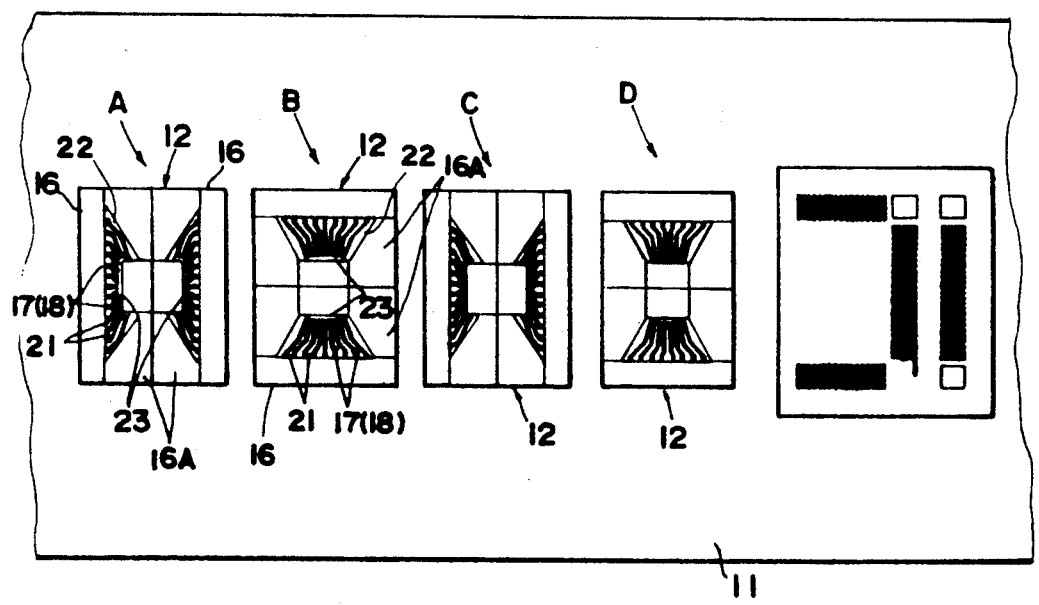
FIG. 4 is a plan view of a lower die of the example of the present invention.

The male dies 12 having the punches 17 and the reinforcing punch 23 are provided to the upper template 11 so that the plate can be punched in each of the first to the fourth process represented by characters A, B, C and D in FIG. 4. The female dies 14 having the holes 25 and the lateral hole 26 are provided to the lower template 13 so that the plate can be punched in each of the first to the fourth process represented by characters A, B, C and D in FIG. 5.

Next, the working action of the aforementioned structure will be explained.

Figure 5:
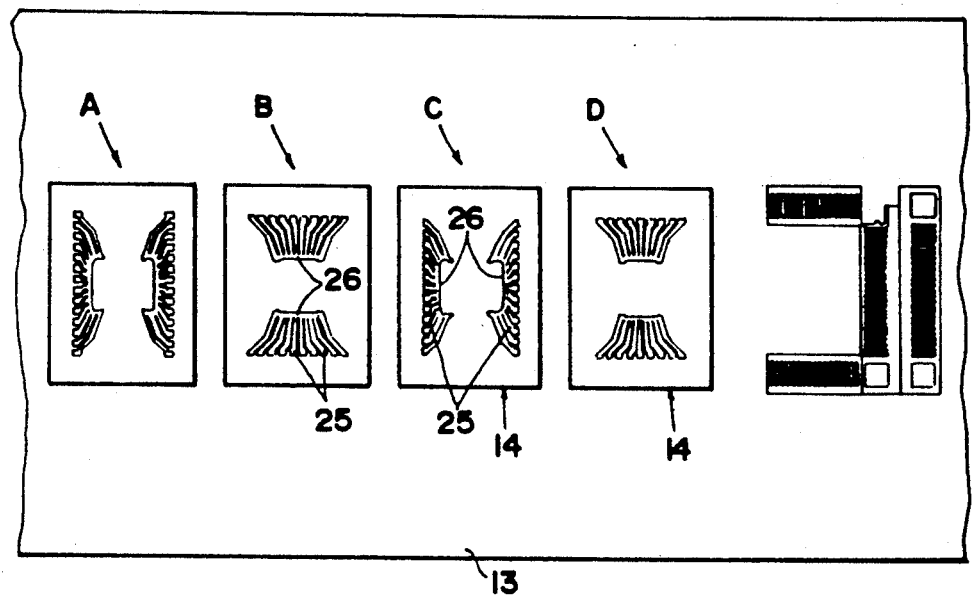
FIG. 5 is a plan view of an upper die of the example of the present invention.

When a plate (not shown) is intermittently fed between the dies, the plate is punched by the male die 12 and the female die 14 of the first to the fourth process represented by characters A to D in FIGS. 4 and 5, so that the lead frame can be continuously produced. In the case where the punches 17 and the reinforcing punch 23 are simultaneously inserted into the holes 25 and the lateral holes 26 to punch the plate, the strength of the punches 17 can be improved since they are connected with each other by the reinforcing punch 23. Therefore, the punches 17 are not deformed and damaged. Accordingly, a large number of harrow punch holes (not shown) formed between narrow leads (not shown) can be simultaneously punched.

As explained above, in the case of the aforementioned example, in the male die 12 in which the punches 17 of narrow width are provided protruding from the base 16 and mutually separated at small intervals, a reinforcing punch 23 is provided to one side 19 of the cutting blades 18 of the punches 17. Therefore, the strength of the punches 17 can be improved, and a large number of punch holes can be formed in a single punching operation.

Since the punches 17 are provided extending to the base 16 side, the punches 17, the reinforcing punch 23 and the base 16 are integrally structured, so that the male die 12, having a further improved strength ca be provided.

Figure 6:
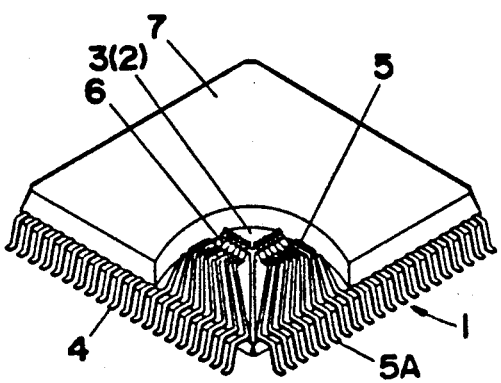
FIG. 6 is a partially cut-out perspective view of an IC.
Figure 7:
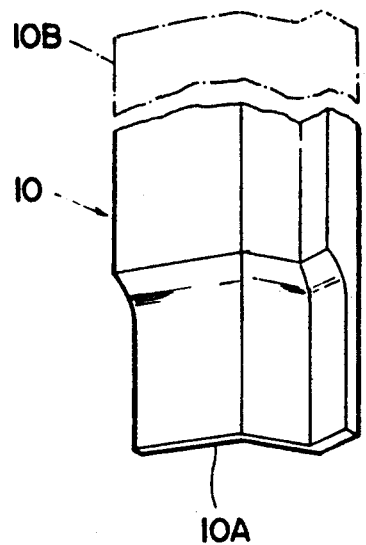
FIG. 7 is a perspective view showing a punch of a conventional example.
Figure 8:
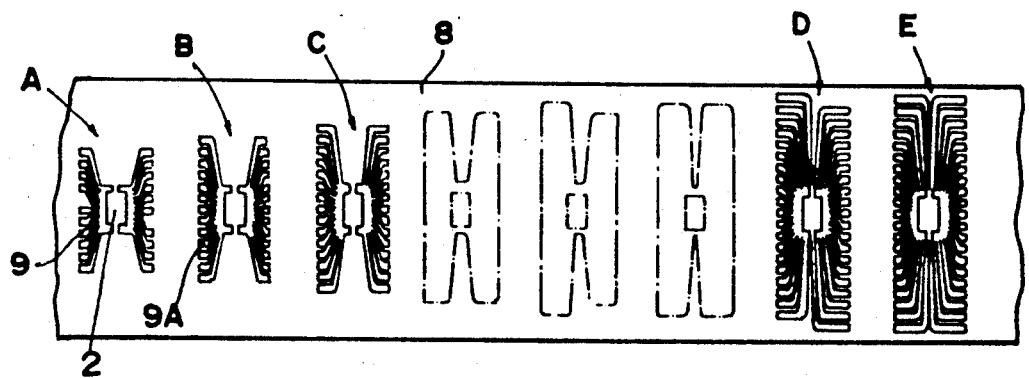
FIG. 8 is a plan view of the conventional example.

Furthermore, the reinforcing punch 23 not only reinforces the punches 17 but also forms a punch hole by itself. Accordingly, the number of the producing processes can be reduced. Especially the aforementioned reinforcing punch 23 is effective because it is disposed in a position corresponding to the inner lead 5 shown in FIG. 6, in other words, in a position where the widths of the punches 17 are narrow.

Figure 9:
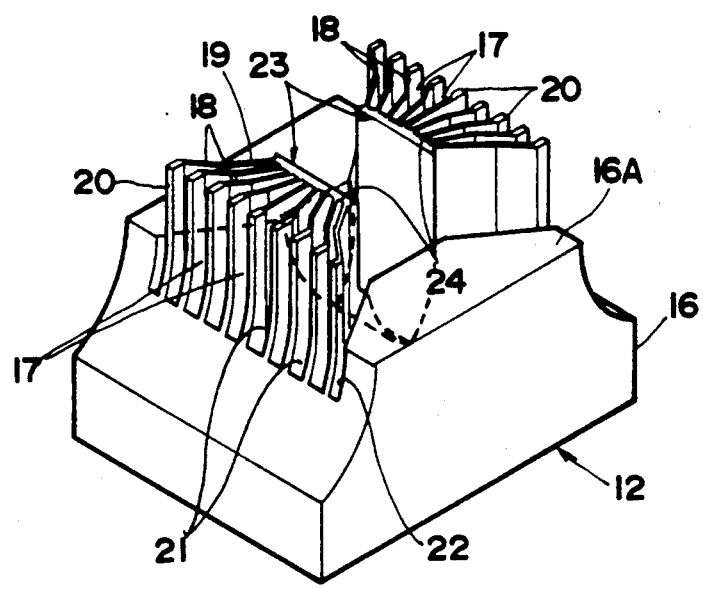
FIG. 9 is a perspective view of another example.

The present invention is not limited to the aforementioned example. For example, a pair of right and left punches 17 may be provided as shown in FIG. 9, or the reinforcing punch 23 may be provided not on one side of the tips of the punches but on the other side. Further, many variations are possible such that the tip of the reinforcing punch may not be disposed on the same surface as that of the tips of the punches, and may be protruded a little, or may be slightly caved in from the surface of the tips of the punches. Also, the present invention can be applied to the production of precision punched parts other than the production of the lead frame shown in the aforementioned example.

The present invention is to provide a die for use in fine press working having a male die from which a plurality of punches protrude approximately radially, and a female die provided with a plurality of holes into which the aforementioned punches are inserted so as to form punch holes in a work piece, comprising: a base provided to the aforementioned male die, wherein the aforementioned plurality of punches are provided integrally protruding from the base; and a reinforcing punch provided between the tips of the aforementioned plurality of punches in such a manner that the reinforcing punch is formed integrally with the aforementioned punches and base. Accordingly, the strength of the punch can be improved and a large number of punch holes can be formed by a single process.

In the present invention, the work piece is a lead frame, and the aforementioned reinforcing punch is correspondingly provided on the inner lead side. Accordingly, the lead frame can be excellently formed.

What is claimed is:

1. A die for fine process working, having a male die and a female die, said male die comprising a base pad, a reinforcing punch extending from said base pad and having an elongate cutting face, a plurality of punches extending from said base pad, said plurality of punches having elongate cutting faces which are connected to, and extend from, said reinforcing punch elongate cutting face, said base pad having slots communicating with spaces between said plurality of punches, said slots being in line with said spaces between said plurality of punches to allow for passage of a wire capable of machining said punches, said female die comprising a plurality of holes into which said plurality of punches can be inserted, and a lateral hole into which said reinforcing punch can be inserted.

2. A die for fine process working according to claim 1, wherein each of said plurality of punches has a narrow inner lead side adjacent said reinforcing punch and a broader outer lead side extending away from said reinforcing punch.

3. A die for fine process working according to claim 2, wherein said reinforcing punch is thicker than said punches on the inner lead side.

4. A die for fine process working according to claim 1, wherein the male die is made of cemented carbide, and wherein the base pad, the punches, and the reinforcing punch are integrally provided.

5. A die for fine process working according to claim 1, wherein said slots are provided outside of said plurality of punches on said base pad portion.

6. A die for fine process working according to claim 1, wherein said plurality of holes are formed slightly larger than said plurality of punches, and said lateral hole is also formed slightly larger than said reinforcing punch.

7. A die for fine process working according to claim 3, 4, 5, 6 or 7, wherein fine holes punched in said work piece plate are lead frames applied for IC chips.

8. A die for fine process working according to claim 3 or 5, wherein said reinforcing punch is thicker than said punches on the inner lead side.

* * * * *